US012746754B2

(12) United States Patent
Lee et al.

(10) Patent No.: US 12,746,754 B2
(45) Date of Patent: Sep. 29, 2026

(54) APPARATUS FOR MANUFACTURING DISPLAY DEVICES

(71) Applicant: Samsung Display Co., LTD., Yongin-si (KR)

(72) Inventors: Byeong Jun Lee, Yongin-si (KR); Jae Sik Kim, Yongin-si (KR); Jung Han Seo, Yongin-si (KR); Woo Yong Sung, Yongin-si (KR); Kwan Hyuck Yoon, Yongin-si (KR); Seung Ho Yoon, Yongin-si (KR); Hye Min Lee, Yongin-si (KR); Seung Gun Chae, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 119 days.

(21) Appl. No.: 18/733,708

(22) Filed: Jun. 4, 2024

(65) Prior Publication Data

US 2025/0100280 A1 Mar. 27, 2025

(30) Foreign Application Priority Data

Sep. 21, 2023 (KR) ........................ 10-2023-0126239

(51) Int. Cl.

| | |
|---|---|
| ***B41J 2/14*** | (2006.01) |
| ***B41J 2/16*** | (2006.01) |
| ***B41J 2/175*** | (2006.01) |
| ***H10K 71/13*** | (2023.01) |

(52) U.S. Cl.

CPC ......... *B41J 2/1433* (2013.01); *B41J 2/14201* (2013.01); *B41J 2/1606* (2013.01); *B41J 2/164* (2013.01); *B41J 2/175* (2013.01); *H10K 71/135* (2023.02); *B41J 2002/14475* (2013.01)

(58) Field of Classification Search

CPC .... B41J 2/1433; B41J 2/14201; B41J 2/1606; B41J 2/164; B41J 2/175; B41J 2002/14475; H10K 71/135; H10K 71/00

USPC ............................................................ 347/47

See application file for complete search history.

(56) References Cited

U.S. PATENT DOCUMENTS

| | | | | |
|---|---|---|---|---|
| 10,737,359 | B2 | 8/2020 | Smith | |
| 2005/0190231 | A1* | 9/2005 | Lim ....................... | B41J 2/1628 347/45 |
| 2011/0018938 | A1* | 1/2011 | Rivas ..................... | B41J 2/1606 347/45 |
| 2011/0242219 | A1* | 10/2011 | Nepomnishy .......... | B41J 2/1639 216/37 |

(Continued)

FOREIGN PATENT DOCUMENTS

| | | | |
|---|---|---|---|
| EP | 2883977 | A1 | 6/2015 |
| JP | 4540296 | B2 | 7/2010 |

(Continued)

*Primary Examiner* — Jason S Uhlenhake
*Assistant Examiner* — Alexander D Shenderov
(74) *Attorney, Agent, or Firm* — CANTOR COLBURN LLP

(57) ABSTRACT

An apparatus for manufacturing display devices includes: a stage; and a head unit disposed on the stage and including a nozzle unit. The head unit further includes a first coating portion covering a bottom surface of the head unit and at least a part of an inner surface of the nozzle unit, and where a thickness of at least a part of the first coating portion becomes narrower toward a top of the first coating portion.

20 Claims, 15 Drawing Sheets

(56) References Cited

U.S. PATENT DOCUMENTS

2015/0158300 A1* 6/2015 Ueda .................... B23P 15/16
29/890.1

FOREIGN PATENT DOCUMENTS

| | | | |
|---|---|---|---|
| JP | 6878902 | B2 | 5/2021 |
| KR | 100705642 | B1 | 4/2007 |
| WO | 2004011186 | A1 | 2/2004 |

* cited by examiner

APPARATUS FOR MANUFACTURING DISPLAY DEVICES

This application claims priority to Korean Patent Application No. 10-2023-0126239, filed on Sep. 21, 2023, and all the benefits accruing therefrom under 35 U.S.C. § 119, the content of which in its entirety is herein incorporated by reference.

BACKGROUND

1. Field

The disclosure relates to a method for manufacturing display devices.

2. Description of the Related Art

Display devices become more and more important as multimedia technology evolves. Examples of such display devices include a liquid-crystal display ("LCD"), an organic light-emitting display ("OLED"), etc. Such display devices find a variety of applications including mobile electronic devices, e.g., portable electronic devices such as smart phones, smart watches and tablet personal computers ("PCs").

An organic light-emitting display device includes a display panel including organic light-emitting elements. In an organic light-emitting element, a cathode electrode and an anode electrode are disposed around an organic emissive layer. When a voltage is applied to the two electrodes, i.e., the cathode electrode and the anode electrode, a visible light is generated in the organic emissive layer connected to the two electrodes.

In order to form an organic emissive layer of an organic light-emitting display device, an inkjet printing device may be used. In an inkjet printing device, an ink or a solution is applied to an inkjet head, and the inkjet head performs a process of ejecting the ink or solution onto a substrate to be processed (e.g., target substrate) while the substrate moves back and forth.

SUMMARY

Features of the disclosure provide an apparatus for manufacturing display devices that may adjust the diameter of nozzles.

Features of the disclosure also provide an apparatus for manufacturing display devices with the improved ink ejection rate.

Features of the disclosure also provide an apparatus for manufacturing display devices that may control ink ejection characteristics.

It should be noted that features of the disclosure are not limited to the above-mentioned feature; and other features of the disclosure will be apparent to those skilled in the art from the following descriptions.

According to a feature of the disclosure, there is provided an apparatus for manufacturing display devices, the apparatus including, a stage, and a head unit disposed on the stage and including a nozzle unit, where the head unit further includes a first coating portion covering a bottom surface of the head unit and at least a part of an inner surface of the nozzle unit, and where a thickness of at least a part of the first coating portion becomes narrower toward a top of the first coating portion.

In an embodiment, the first coating portion has a Venturi tube shape or an orifice shape.

In an embodiment, the first coating portion comprises, a first portion disposed on the bottom surface of the head unit, a second portion disposed on one side of the first portion, and a third portion disposed on one side of the second portion and disposed on the inner surface of the nozzle unit.

In an embodiment, a thickness of the third portion becomes narrower toward the top of the first coating portion.

In an embodiment, the thickness of the third portion is smaller than a thickness of the first portion.

In an embodiment, an average of the thickness of the third portion is 0.3 times or less than the thickness of the first portion.

In an embodiment, a width of at least a part of the nozzle unit becomes narrower toward a top of the nozzle unit.

In an embodiment, the nozzle unit has a Venturi tube or funnel shape.

In an embodiment, the head unit further comprises an ink reservoir which stores an ink, where the nozzle unit comprises, a first passage connected to the ink reservoir, a second passage connected to the first passage, and a third passage connected to the second passage, and where the second passage becomes wider to the top of the nozzle unit.

In an embodiment, at least one of a width of the first passage and a width of the third passage is constant.

In an embodiment, the head unit further comprises an ejection controller disposed outside the nozzle unit, and where the first coating portion does not overlap with the ejection controller.

In an embodiment, the first coating portion is not in direct contact with the ejection controller.

In an embodiment, the ejection controller comprises a piezoelectric element.

In an embodiment, the first coating portion exposes at least a part of the inner surface of the nozzle unit.

In an embodiment, the first coating portion is formed by a physical vapor deposition process.

In an embodiment, the apparatus may further comprise, a second coating portion disposed between the first coating portion and the bottom surface of the head unit and between the first coating portion and at least a part of the inner surface of the nozzle unit.

In an embodiment, a thickness of the second coating portion is constant.

In an embodiment, the second coating portion comprises, a first portion disposed on the bottom surface of the head unit, a second portion disposed on one side of the first portion, and a third portion disposed on one side of the second portion and disposed on the inner surface of the nozzle unit.

In an embodiment, the thicknesses of the first to third portions are equal to each other.

In an embodiment, the second coating portion is formed by an atomic layer deposition process.

In an embodiment of the disclosure, the diameter of nozzles of an apparatus for manufacturing display devices may be adjusted.

In an embodiment of the disclosure, the ink ejection rate of an apparatus for manufacturing display devices may be improved.

In an embodiment of the disclosure, the ink ejection characteristics of an apparatus for manufacturing display devices may be adjusted.

It should be noted that effects of the disclosure are not limited to those described above and other effects of the disclosure will be apparent to those skilled in the art from the following descriptions.

BRIEF DESCRIPTION OF THE DRAWINGS

The above and other advantages and features of the disclosure will become more apparent by describing in detail embodiments thereof with reference to the attached drawings, in which.

DETAILED DESCRIPTION

Figure 1:
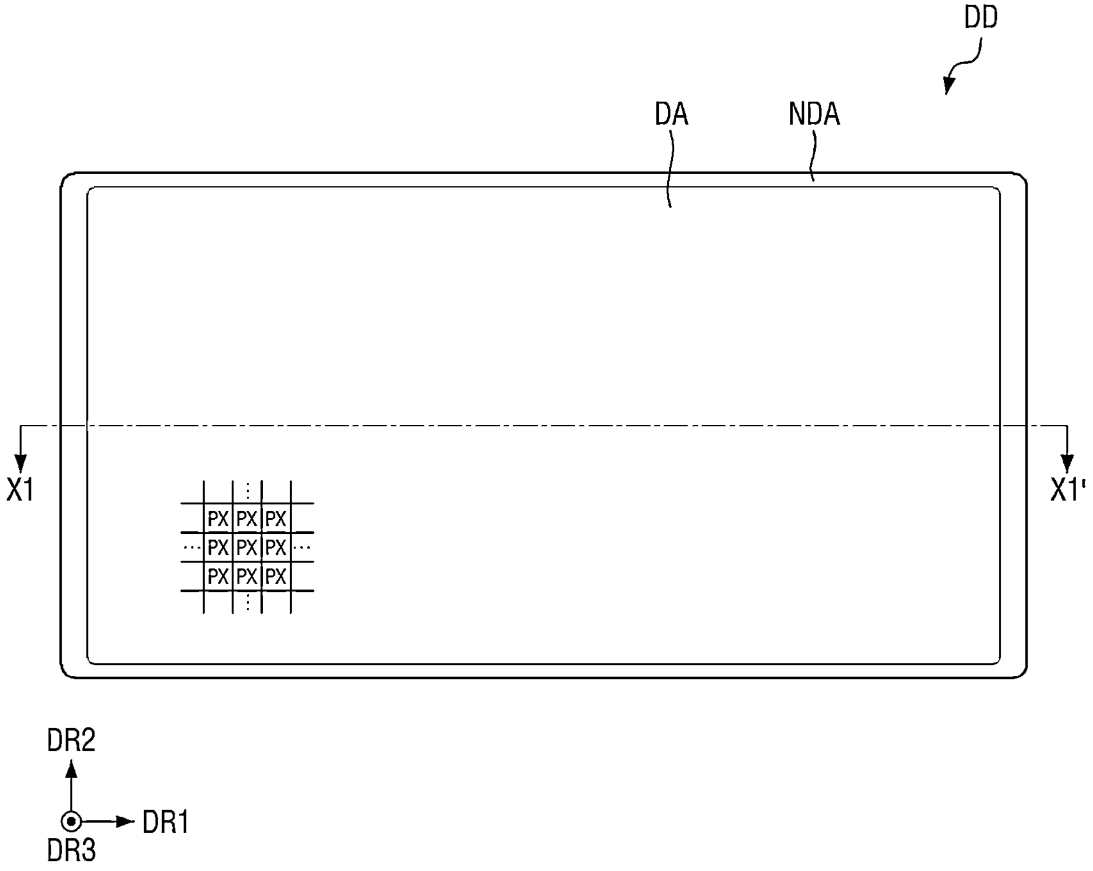
FIG. 1 is a plan view showing an embodiment of a display device according to the disclosure.

Embodiments of the disclosure will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is also referred to as being "on" another layer or substrate, it may be directly on the other layer or substrate, or intervening layers may also be present. The same reference numbers indicate the same components throughout the specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, embodiments of the disclosure will be described in detail with reference to the accompanying drawings.

FIG. 1 is a plan view showing an embodiment of a display device according to the disclosure.

Referring to FIG. 1, a display device DD may refer to any electronic device that provides a display screen. The display device DD may display moving images or still images. In an embodiment, the display device DD may include a television set, a laptop computer, a monitor, an electronic billboard, the Internet of Things devices, a mobile phone, a smart phone, a tablet personal computer ("PC"), an electronic watch, a smart watch, a watch phone, a head-mounted display device, a mobile communications terminal, an electronic notebook, an electronic book, a portable multimedia player ("PMP"), a navigation device, a game console and a digital camera, a camcorder, etc., for example.

According to the embodiment of the disclosure, the display device DD may have a quadrangular shape, e.g., rectangular shape when viewed from the top. The display device DD may include two longer sides extended in a first direction DR1, and two shorter sides extended in a second direction DR2 intersecting the first direction DR1. Although the corners where the longer sides and the shorter sides of the display device DD meet may form a right angle, this is merely illustrative. The display device DD may have rounded corners. In another embodiment, the longer sides may be extended in the second direction DR2, and the shorter sides may be extended in the first direction DR1. The shape of the display device DD when viewed from the top is not limited to that shown in the drawings. The display device DD may have a circular shape or other shapes.

In the drawings, the first direction DR1 and the second direction DR2 intersect each other as the horizontal directions. In an embodiment, the first direction DR1 and the second direction DR2 may be perpendicular to each other, for example. In addition, a third direction DR3 may intersect the first direction DR1 and the second direction DR2, and may be a vertical direction, for example. Herein, the side indicated by the arrow of each of the first to third directions DR1, DR2 and DR3 may be also referred to as a first side, while the opposite side may be also referred to as a side opposite side unless specifically state otherwise.

The display device DD may include a display panel for providing a display screen. In embodiments, the display panel may include an inorganic light-emitting diode display panel, an organic light-emitting display panel, a quantum-dot light-emitting display panel, a plasma display panel, a field emission display panel, etc. In the following description, an organic light-emitting diode display panel is employed in an embodiment of the display panel, but the disclosure is not limited thereto. Any other display panel may be employed as long as the technical idea of the disclosure may be equally applied.

The display device DD may include a display area DA, and a non-display area NDA disposed around the display area DA. In the display area DA, images are displayed. In the non-display area NDA, images are not displayed. The display area DA may be also referred to as an active area, while the non-display area NDA may also be also referred to as an inactive area. The display area DA may generally occupy the center of the display device DD, and the non-display area NDA may surround the display area DA.

The display area DA may include a plurality of pixels PX. The plurality of pixels PX may be disposed in a matrix. The shape of each pixel PX may be, but is not limited to, a rectangle or a square when viewed from the top. Each pixel may have a diamond shape having sides inclined with respect to a direction.

As described above, the non-display areas NDA may be disposed around the display area DA. The non-display area NDA may surround the display area DA entirely or partially. The display area DA may have a quadrangular shape, e.g., rectangular shape, and the non-display area NDA may be adjacent to the four sides of the display area DA. The non-display area NDA may form the bezel of the display device DD. Lines or circuit drivers included in the display device DD may be disposed in each of the non-display area NDA, or external devices may be disposed (e.g., mounted).

Figure 2:
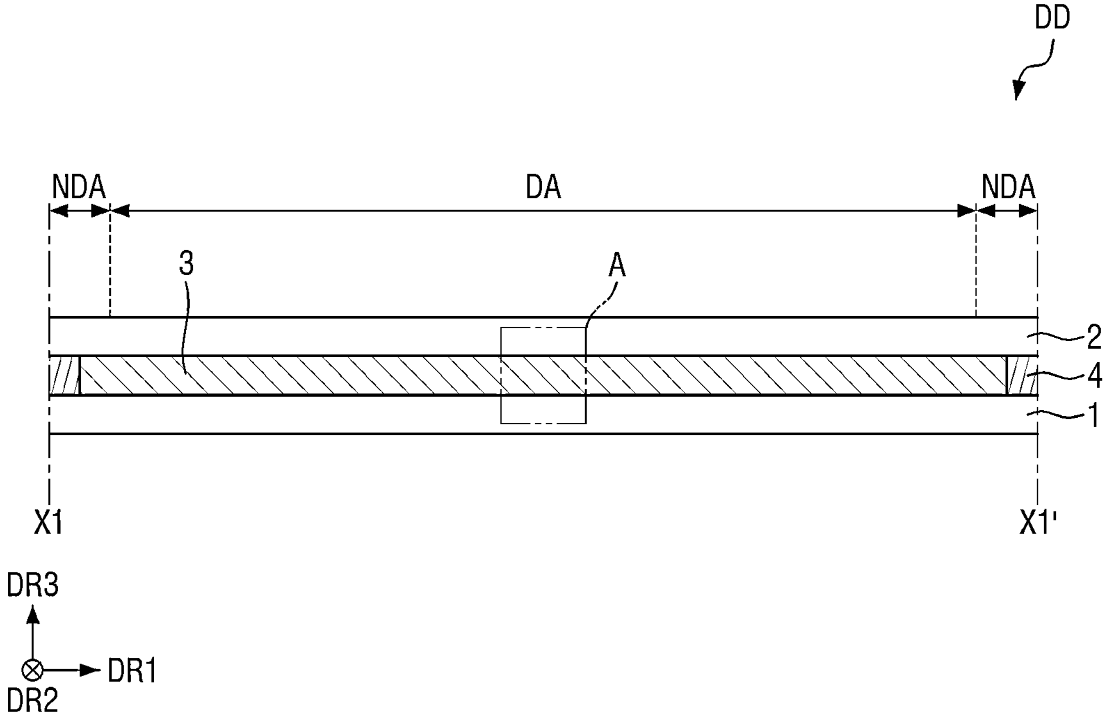
FIG. 2 is a cross-sectional view taken along line X1-X1' in FIG. 1.

FIG. 2 is a cross-sectional view taken along line X1-X1' in FIG. 1.

Referring to FIG. 2, the display device DD may include a display substrate 1, a color conversion substrate 2 facing the display substrate 1, a sealing member 4 that couples the display substrate 1 with the color conversion substrate 2, and a filler 3 filled between the display substrate 1 and the color conversion substrate 2.

The display substrate 1 may include elements and circuits for displaying images, e.g., a pixel circuit such as a switching element, a pixel-defining layer for defining an emission area and a non-emission area, and a self-light-emitting element. According to the embodiment, the self-light-emitting element may include at least one of an organic light-emitting diode, a quantum-dot light-emitting diode, an inorganic-based micro light-emitting diode (e.g., "micro LED"), and an inorganic-based nano light-emitting diode (e.g., "nano LED").

The color conversion substrate 2 may be disposed on the display substrate 1 and may face the display substrate 1. According to the embodiment, the color conversion substrate 2 may include a color conversion pattern that converts the color of incident light. According to the embodiment, the color conversion pattern may include at least one of color filters and wavelength conversion pattern.

The sealing member 4 may be disposed between the display substrate 1 and the color conversion substrate 2 in the non-display area NDA. The sealing member 4 may be disposed along the edges of the display substrate 1 and the color conversion substrate 2 in the non-display area NDA to surround the display area DA when viewed from the top. The display substrate 1 and the color conversion substrate 2 may be coupled to each other via the sealing member 4.

The filler 3 may be disposed in the space between the display substrate 1 and the color conversion substrate 2 surrounded by the sealing member 4. The filler 3 may be used to fill the space between the display substrate 1 and the color conversion substrate 2. The filler 3 may include or consist of a material that transmits light. In some embodiments, the filler 3 may be eliminated.

Figure 3:
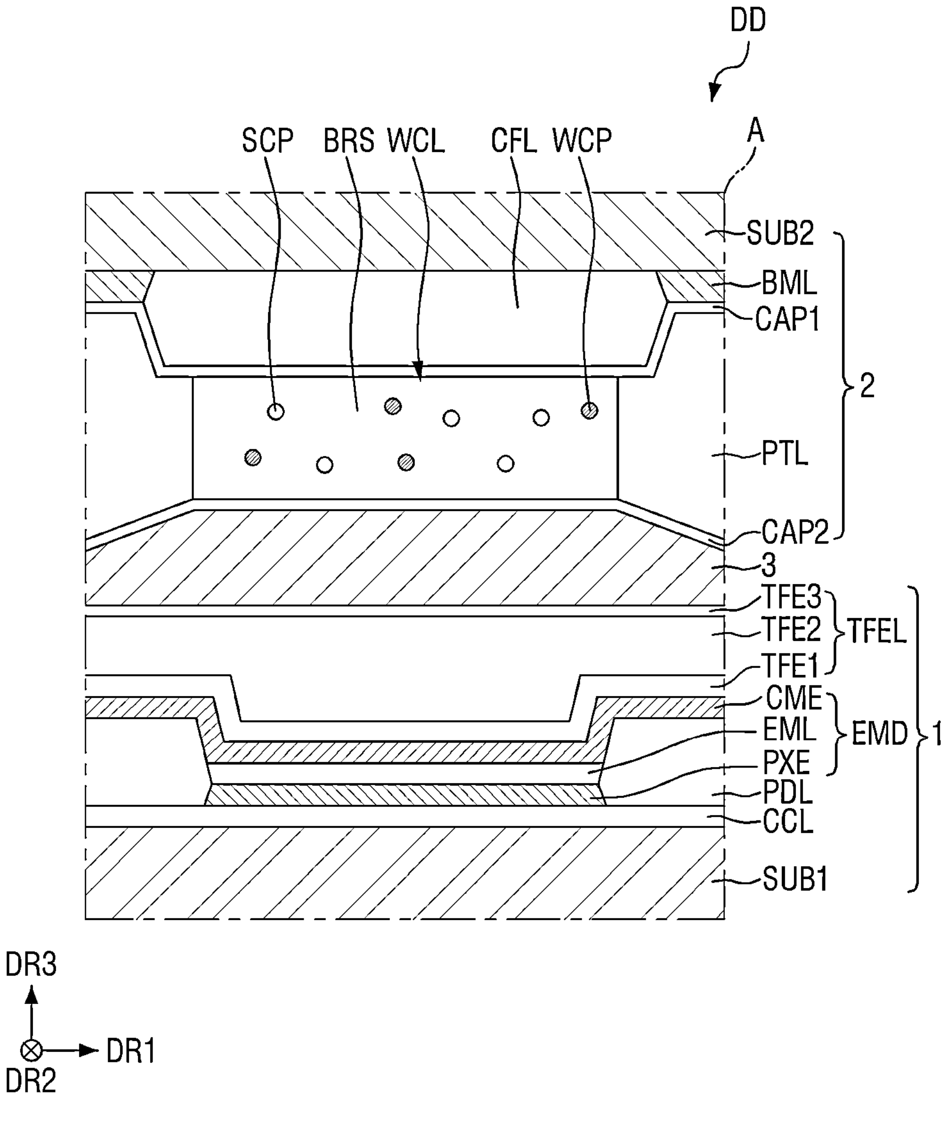
FIG. 3 is an enlarged view of area A of FIG. 2.

FIG. 3 is an enlarged view of area A of FIG. 2.

Referring to FIG. 3, the display device DD may include a display substrate 1, a color conversion substrate 2 facing the display substrate 1, and a filler 3 filled between the display substrate 1 and the color conversion substrate 2.

The display substrate 1 may include a first base substrate SUB1, a circuit layer CCL, a pixel-defining film (also referred to as a pixel-defining layer) PDL, a light-emitting element EMD, and a thin-film encapsulation layer TFEL.

The first base substrate SUB1 may include a transparent material. In an embodiment, the first base substrate SUB1 may include a transparent insulating material such as glass and quartz, for example. The first base substrate SUB1 may be a rigid substrate. However, the first base substrate SUB1 is not limited to those described above. The first base substrate SUB1 may include a plastic such as polyimide or may be flexible so that it may be curved, bent, folded or rolled.

A circuit layer CCL may be disposed on the first base substrate SUB1. The circuit layer CCL may include transistors that drive the light-emitting elements EMD and a variety of circuit lines. The circuit layer CCL may be disposed between the first base substrate SUB1 and the light-emitting elements EMD. The circuit layer CCL will be described later with reference to FIG. 4.

The pixel-defining layer PDL may be disposed on the pixel electrode PXE along the border of the pixel PX. The pixel-defining film PDL may define an opening that exposes at least a part of the pixel electrode PXE. The emission area and the non-emission area may be separated from each other by the pixel-defining film PDL and the openings thereof.

The pixel-defining film PDL may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene ("BCB"). The pixel-defining layer PDL may include an inorganic material.

The light-emitting element EMD may be disposed on the circuit layer CCL. Although FIG. 3 shows one light-emitting element EMD in a single PX, the display substrate 1 may include a plurality of light-emitting elements EMD disposed the pixels PX, respectively.

The light-emitting element EMD may include a pixel electrode PXE, an emissive layer EML, and a common electrode CME.

The pixel electrode PXE may be disposed on the circuit layer CCL of the display substrate 1. The pixel electrode PXE may be a first electrode, e.g., an anode electrode of the light-emitting element EMD. The pixel electrode PXE may have a stack structure of a material layer having a relatively high work function such as indium-tin-oxide ("ITO"), indium-zinc-oxide ("IZO"), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca) or any combinations thereof. A material layer having a higher work function may be disposed on a higher layer than a reflective material layer so that it may be closer to the emissive layer EML. The pixel electrode PXE may have, but is not limited to, a multilayer structure of ITO/Mg, ITO/MgF, ITO/Ag, and ITO/Ag/ITO.

The emissive layer EML may be disposed on the pixel electrode PXE exposed by the pixel-defining layer PDL. In an embodiment where the display device DD is an organic light-emitting display device, the emissive layer EML may include an organic layer including an organic material. The organic layer includes an organic, emissive layer and may further include at least one of a hole injection layer, a hole transport layer, an electron injection layer and an electronic transport layer as an auxiliary layer in some implementations to facilitate emission. In another embodiment where the display device DD is a micro LED display device, a nano LED display device, etc., the emissive layer EML may include an inorganic material such as an inorganic semiconductor. In some embodiments, the emissive layer EML may be formed using the apparatus 10 (refer to FIG. 5), which will be described later.

In an embodiment, the emissive layers EML of the different pixels PX may emit light of the same wavelength. In an embodiment, the emissive layer EML of each pixel PX may emit blue light or ultraviolet light, and the color conversion substrate 2 may include a wavelength conversion layer WCL, so that different pixels PX may display lights of different colors, which will be described later, for example. In another embodiment, the emissive layers EML of the different pixels PX may emit light of different wavelengths.

The common electrode CME may be disposed on the emissive layer EML. The common electrode CME may be extended across the pixels PX. The common electrode CME may be disposed on the entirety of the surface across the pixels PX. The common electrode CME may be a second electrode, e.g., a cathode electrode of a light-emitting element EMD. The common electrode CME may include a material layer having a relatively small work function such as Li, Ca, LiF/Ca, LiF/Al, Al, Mg, Ag, Pt, Pd, Ni, Au, Nd, Ir, Cr, BaF and Ba, or a compound or combination thereof (e.g., a combination of Ag and Mg). The common electrode CME may further include a transparent metal oxide layer disposed on the material layer having a relatively small work function.

The thin-film encapsulation layer TFEL may be disposed on the common electrode CME. The thin-film encapsulation layer TFEL may include a first inorganic film TFE1, an organic film TFE2 and a second inorganic film TFE3.

The first inorganic film TFE1 may be disposed on the light-emitting element EMD. The first organic film TFE1 may include silicon nitride (SiNx), silicon oxide (SiOx), or silicon oxynitride (SiOxNy).

The organic film TFE2 may be disposed on the first inorganic film TFE1. The organic film TFE2 may include an organic insulating material such as polyacrylate resin, epoxy resin, phenolic resin, polyamide resin, polyimide resin, unsaturated polyesters resin, polyphenylene ether resin, polyphenylene sulfide resin, and benzocyclobutene ("BCB").

The second inorganic film TFE3 may be disposed on the organic film TFE2. The second organic film TFE3 may include or consist of the same material as that of the first inorganic film TFE1 described above. In an embodiment, the second organic film TFE3 may include silicon nitride (SiNx), silicon oxide (SiOx), or silicon oxynitride (SiOxNy), for example.

The color conversion substrate 2 may be disposed above the thin-film encapsulation layer TFEL to face the display substrate 1. Specifically, the color conversion substrate 2 may face the display substrate 1 with the filler 3 therebetween.

The color conversion substrate 2 may include a second base substrate SUB2, a light-blocking member BML, a color filter layer CFL, a first capping layer CAP1, partition walls PTL, a wavelength conversion layer WCL, and a second capping layer CAP2.

The second base substrate SUB2 may include a transparent material. In an embodiment, the second base substrate SUB2 may include a transparent insulating material such as glass and quartz, for example. The second base substrate SUB2 may be a rigid substrate. However, the second base substrate SUB2 is not limited to those described above. The second base substrate SUB2 may include a plastic such as polyimide or may be flexible so that it may be curved, bent, folded or rolled.

The second base substrate SUB2 may be of the same type as the first base substrate SUB1 or may have different material, thickness, transmittance, etc. In an embodiment, the second base substrate SUB2 may have a higher transmittance than the first base substrate SUB1, for example. The second base substrate SUB2 may be either thicker or thinner than the first base substrate SUB1.

The light-blocking member BML may be disposed along the boundary of the pixels PX on one surface of the second base substrate SUB2 facing the first base substrate SUB1. The light-blocking member BML may overlap the pixel-defining layer PDL of the display substrate 1. The light-blocking member BML may define an opening exposing a surface of the second base substrate SUB2 and may be formed in a lattice pattern when viewed from the top (not shown).

The light-blocking member BML may include an organic material. The light-blocking member BML may absorb external light, thereby reducing color distortion due to reflection of external light. In addition, the light-blocking member BML may prevent light emitted from the emissive layer EML from intruding into adjacent pixels PX.

The color filter layers CFL may be disposed on the surface of the second base substrate SUB2 where the light-blocking member BML is disposed. The color filter layer CFL may be disposed on the surface of the second base substrate SUB2 exposed through the opening of the light-blocking member BML. In some embodiments, the color filter layer CFL may be formed using the apparatus 10 (refer to FIG. 5), which will be described later.

The color filter layer CFL may include a colorant such as a dye and a pigment which absorb wavelengths other than the wavelength of a particular color. The color filter layer CFL may include colorants of different colors for different pixels PX. In an embodiment, the color filter layer CFL may include a red colorant, a green colorant, and a blue colorant, for example.

A first capping layer CAP1 may be disposed on the color filter layer CFL. The first capping layer CAP1 may prevent permeation of impurities such as moisture and air. In addition, the first capping layer CAP1 may prevent the colorant of the color filter layer CFL from being diffused into other elements.

The partition walls PTL may be disposed on the first capping layer CAP1. The partition walls PTL may be disposed such that they overlap with the light-blocking member BML. The partition wall PTL may define an opening via which the color filter layer CFL is exposed. The partition walls PTL may include, but is not limited to, a photosensitive organic material. The partition walls PTL may further include a light-blocking material.

The wavelength conversion layer WCL may be disposed in the space exposed by the openings of the partition walls PTL. In some embodiments, the wavelength conversion layer WCL may be formed using the apparatus 10 (refer to FIG. 5), which will be described later.

The wavelength conversion layer WCL may convert the wavelength of light incident from the emissive layer EML. The wavelength conversion layer WCL may include a base resin BRS, scattering particles SCP dispersed in the base resin BRS, and wavelength-converting particles WCP.

The base resin BRS may include a transparent organic material. In an embodiment, the base resin BRS may include an epoxy resin, an acrylic resin, a cardo resin, or an imide resin, for example.

The wavelength-converting particles WCP may be a material that converts color. The wavelength-converting particles WCP may be quantum dots, quantum rods, phosphors, etc. The quantum dots may include IV nanocrystals, II-VI compound nanocrystals, III-V compound nanocrystals, IV-VI nanocrystals, or combinations thereof.

In another embodiment, the wavelength conversion layer WCL may not include the wavelength-converting particles WCP. When the wavelength conversion layer WCL does not include the wavelength-converting particles WCP, it may work as a light-transmitting layer that transmits light.

The scattering particles SCP may be metal oxide particles or organic particles. In embodiments, the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc. In embodiments, the material of the organic particles may include an acrylic resin, a urethane resin, etc.

The second capping layer CAP2 may be disposed on the wavelength conversion layer WCL and the partition walls PTL. The second capping layer CAP2 may be disposed on the entirety of the surface of the color conversion substrate 2. The second capping layer CAP2 may prevent permeation of impurities such as moisture and air. The second capping layer CAP2 may include or consist of an inorganic material. The second capping layer CAP2 may include a material selected from among the materials listed above as the materials of the first capping layer CAP1. The second capping layer CAP2 and the first capping layer CAP1 may include or consist of, but is not limited to, the same material as each other.

The filler 3 may be disposed between the display substrate 1 and the color conversion substrate 2. The filler 3 may fill the space between the display substrate 1 and the color conversion substrate 2 and may couple them together. The filler 3 may be disposed between the thin-film encapsulation layer TFEL of the display substrate 1 and the second capping layer CAP2 of the color conversion substrate 2. The filler 3 may include or consist of, but is not limited to, a Si-based organic material, an epoxy-based organic material, etc.

Figure 4:
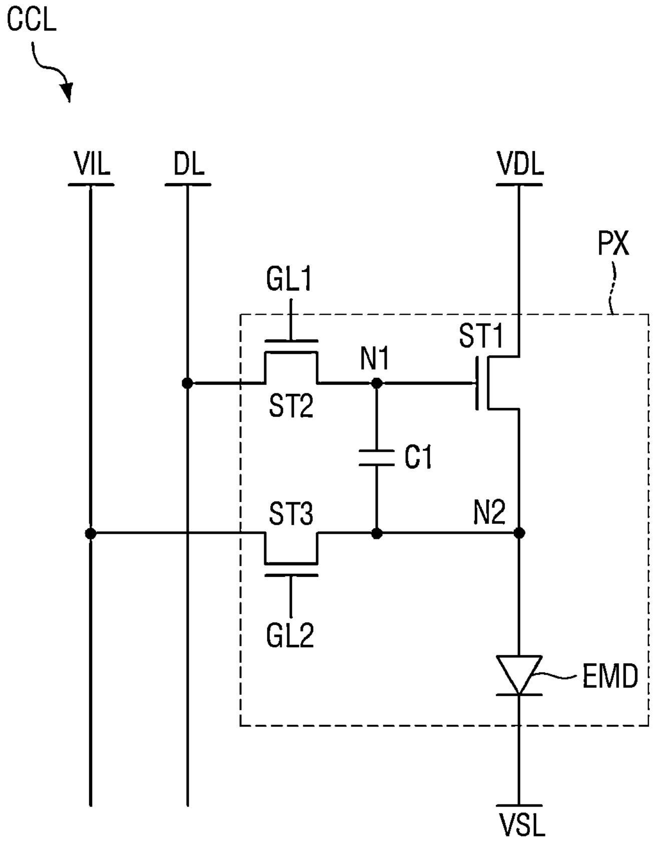
FIG. 4 is a diagram showing an embodiment of an equivalent circuit of a circuit layer according to the disclosure.

FIG. 4 is a diagram showing an embodiment of an equivalent circuit of a circuit layer according to the disclosure.

Referring to FIG. 4, the circuit layer CCL may include a variety of lines for driving the light-emitting element EMD. According to the embodiment of the disclosure, the circuit layer CCL may include a pixel circuit included in each pixel PX, a first voltage line VDL, an initialization voltage line VIL, a first gate line GL1, a second gate line GL2, a data line DL, and a second voltage line VSL.

The pixel PX may include the pixel circuit and the light-emitting element EMD. The pixel circuit may be connected to the first voltage line VDL, the initialization voltage line VIL, the first gate line GL1, the second gate line GL2, the data line DL and the second voltage line VSL.

The first voltage line VDL may supply a driving voltage or a high-level voltage to the pixel circuit. The initialization voltage line VIL may supply an initialization voltage to the pixel circuit. The initialization voltage line VIL may receive a sensing signal from the pixel circuit. The second voltage line VSL may supply a low-level voltage to the light-emitting element EMD. The first gate line GL1 may supply a first gate signal to the pixel circuit. The second gate line GL2 may supply a second gate signal to the pixel circuit. The data line DL may apply data voltage to the pixel circuit.

The pixel circuit may include a first transistor ST1, a second transistor ST2, a third transistor ST3, and a first capacitor C1.

The first transistor ST1 may include a gate electrode, a drain electrode, and a source electrode. The gate electrode of the first transistor ST1 may be connected to a first node N1, the drain electrode thereof may be connected to the first voltage line VDL, and the source electrode thereof may be connected to a second node N2. The first transistor ST1 may control a drain-source current (or a driving current) based on a data voltage applied to the gate electrode. The first transistor ST1 may be a driving transistor for driving the light-emitting element EMD.

The light-emitting element EMD may receive the driving current to emit light. The amount or the brightness of the light emitted from the light-emitting element EMD may be proportional to the magnitude of the driving current. The light-emitting element EMD may be an organic light-emitting diode including an organic light-emitting layer, a quantum-dot LED including a quantum-dot light-emitting layer, a micro LED, or an inorganic LED including an inorganic semiconductor.

The first electrode of the light-emitting element EMD may be connected to the second node N2, and a second electrode of the light-emitting element EMD may be connected to the second voltage line VSL. The first electrode of the light-emitting element EMD may be connected to the source electrode of the first transistor ST1, the drain electrode of the third transistor ST3, and the second capacitor electrode of the first capacitor C1 through the second node N2.

The second transistor ST2 may be turned on by a first gate signal of the first gate line GL1 to electrically connect the data line DL with the first node N1, which is the gate electrode of the first transistor ST1. The second transistor ST2 may be turned on in response to the first gate signal to apply data voltage to the first node N1. The gate electrode of the second transistor ST2 may be connected to the first gate line GL1, the drain electrode thereof may be connected to the data line DL, and the source electrode thereof may be connected to the first node N1. The source electrode of the second transistor ST2 may be connected to the gate electrode of the first transistor ST1 and the first capacitor electrode of the first capacitor C1 through the first node N1. The second transistor ST2 may be a switching transistor that controls electric current flowing through the first transistor ST1 and the light-emitting element EMD.

The third transistor ST3 may be turned on by a second gate signal of the second gate line GL2 to electrically connect the initialization voltage line VIL with the second node N2, which is the source electrode of the first transistor ST1. The third transistor ST3 may be turned on in response to the second gate signal to apply the initialization voltage to the second node N2. The third transistor ST3 may be turned on in response to the second gate signal to provide a sensing signal to the initialization voltage line VIL. The gate electrode of the third transistor ST3 may be connected to the second gate line GL2, the drain electrode may be connected to the second node N2, and the source electrode may be connected to the initialization voltage line VIL. The drain electrode of the third transistor ST3 may be connected to the source electrode of the first transistor ST1 through the second node N2, the second capacitor electrode of the first capacitor C1, and the first electrode of the light-emitting element EMD. The third transistor ST3 may be a switching transistor that controls electric current flowing through the first transistor ST1 and the light-emitting element EMD.

The first capacitor C1 may include a first capacitor electrode and a second capacitor electrode. The first capacitor electrode may be connected to the gate electrode of the first transistor ST1 and the source electrode of the second transistor ST2. The second capacitor electrode may be connected to the source electrode of the first transistor ST1 and the first electrode of the light-emitting element EMD through the second node N2. The second capacitor electrode may be connected to the drain electrode of the third transistor ST3. The first capacitor C1 may store energy using the capacitance formed between the first capacitor electrode and the second capacitor electrode.

Among the above-described patterns of the display device DD, the layers such as the emissive layer EML, the color filter layer CFL and the wavelength conversion layer WCL, e.g., may be formed using the apparatus 10, which will be described later. Hereinafter, the apparatus 10 used to form such patterns will be described.

Figure 5:
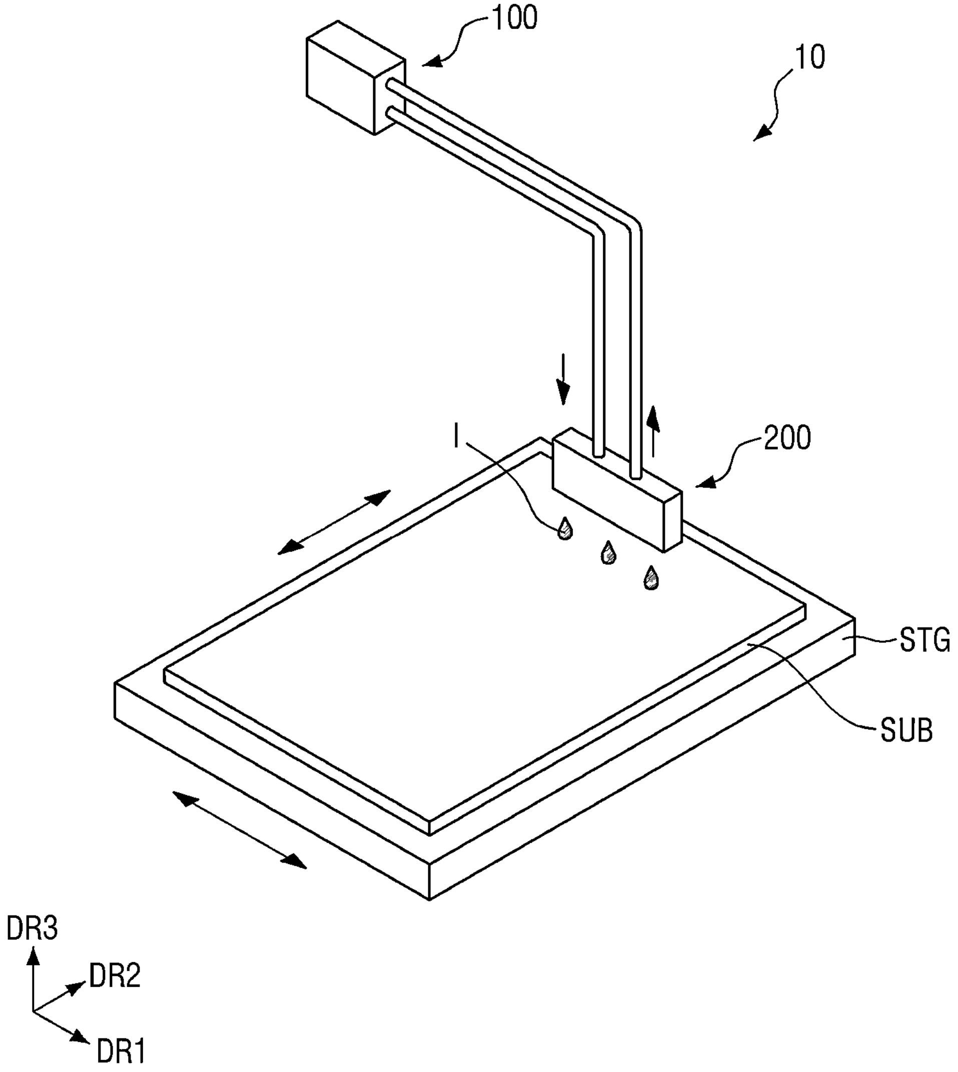
FIG. 5 is a perspective view showing an embodiment of an apparatus for manufacturing display devices according to the disclosure.
Figure 6:
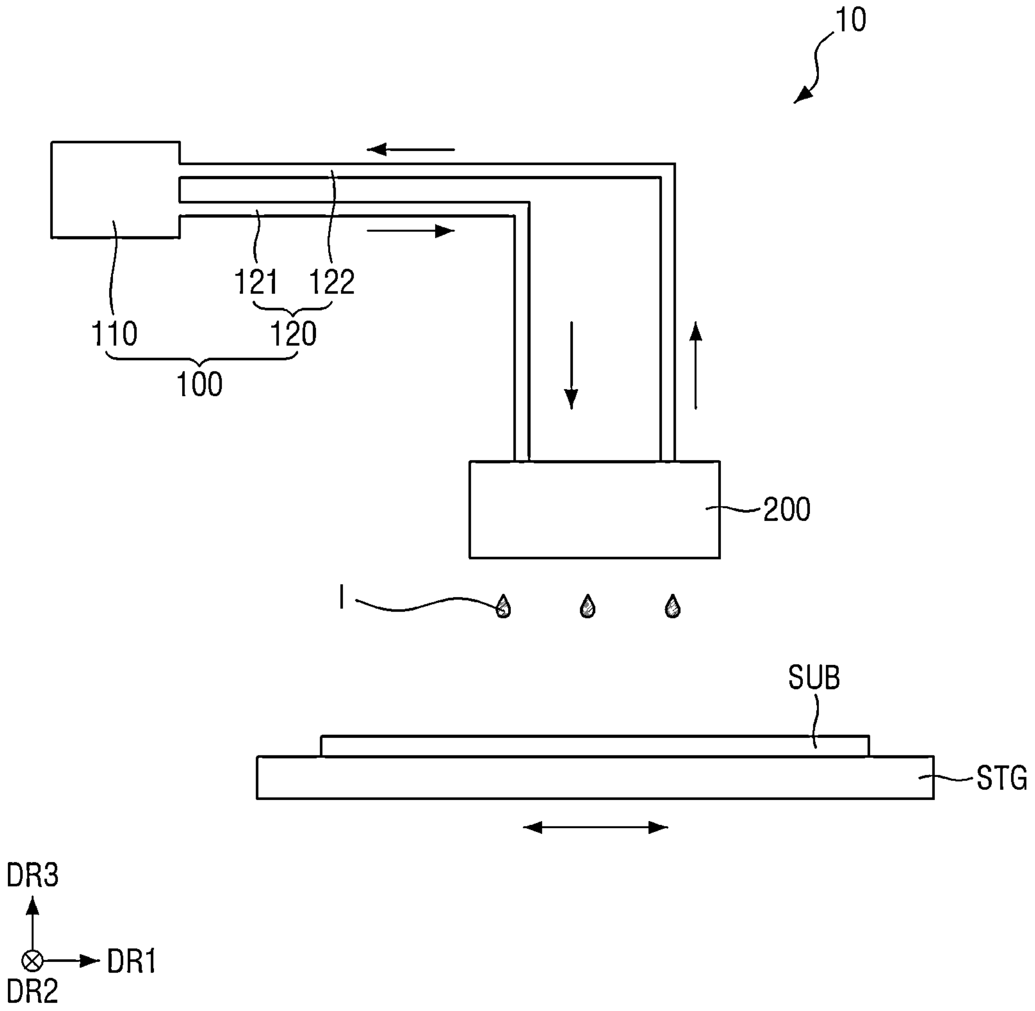
FIG. 6 is a side view showing an embodiment of the apparatus according to the disclosure.
Figure 7:
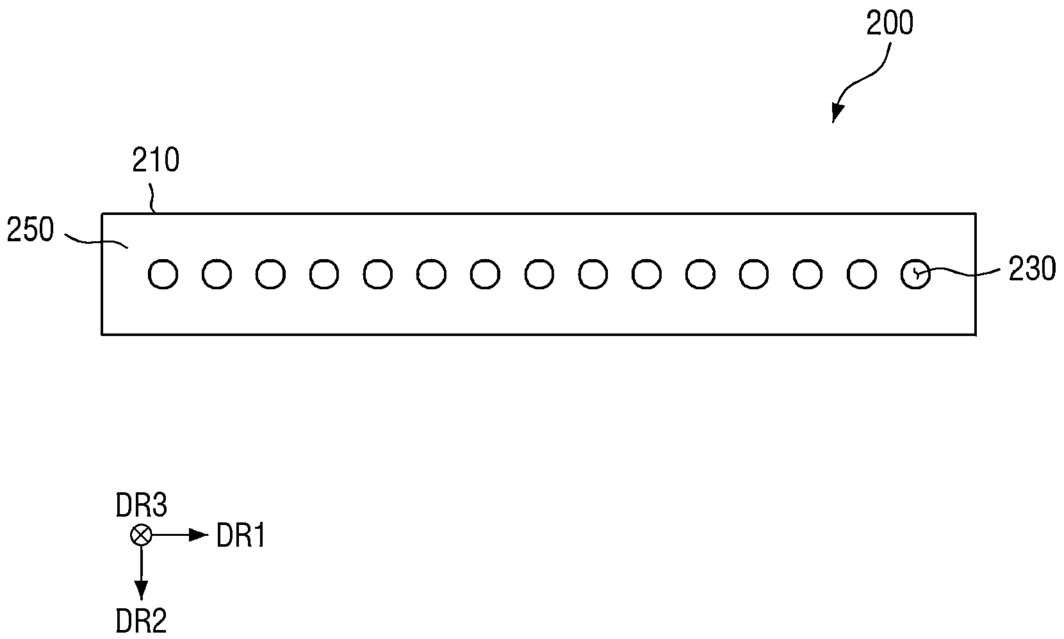
FIG. 7 is a bottom view showing another embodiment of a head unit according to the disclosure.

FIG. 5 is a perspective view showing an embodiment of an apparatus for manufacturing display devices according to the disclosure. FIG. 6 is a side view showing an embodiment of the apparatus according to the disclosure. FIG. 7 is a bottom view showing an embodiment of a head unit according to the disclosure.

Referring to FIGS. 5 to 7, the apparatus 10 for manufacturing display devices in the embodiment may be an inkjet printing device. The apparatus 10 may include a stage STG, a supply unit 100, and a head unit 200.

The stage STG may support a target substrate SUB. The stage STG may provide a space where the target substrate SUB may be seated. The stage STG may move back and forth in the first direction DR1 and/or the second direction DR2 on or by a transfer unit (not shown).

The transfer unit (not shown) may be a transfer device for transferring the stage STG. In an embodiment, the transfer unit (not shown) may include, but is not limited to, a first rail extended in the first direction DR1 and a second rail extended in the second direction DR2, for example.

The target substrate SUB may be placed on the stage STG. In some embodiments of the disclosure, the target substrate SUB may be the first base substrate SUB1 or the second base substrate SUB2 described above with reference to FIG. 3.

The supply unit 100 may supply an ink I to the head unit 200. The supply unit 100 may include an ink supplier 110 and ink pipes 120.

The ink supplier 110 may be a storage tank for storing the ink I. The ink supplier 110 may supply the stored ink I to the head unit 200 through the ink pipes 120.

The ink pipes 120 may be column-shaped pipes that include the internal space through which the ink I may move. The ink pipes 120 may include a first pipe 121 and a second pipe 122. The first pipe 121 may be a passage through which the ink I moves from the ink supplier 110 to the head unit 200. The second pipe 122 may be a passage through which the ink I moves from the head unit 200 to the ink supplier 110. The ink I that is not ejected from the head unit 200 may return to the ink supplier 110 through the second pipe 122 for reuse. The first pipe 121 and the second pipe 122 may further include a pump (not shown) to facilitate the flow of the ink I.

The head unit 200 may be placed above the stage STG.

The head unit 200 may eject the ink I toward the stage STG. The ink I ejected from the head unit 200 may be seated in a plurality of pixels PX or a plurality of cells of the target substrate SUB disposed on the stage STG.

The head unit 200 may eject the ink I while stationary or moving. In an embodiment, in the embodiment of the disclosure, the head unit 200 may eject the ink I as it is stationary while the target substrate SUB is moving. In another embodiment, the head unit 200 may eject the ink I as it is moving while the target substrate SUB is stationary, for example. According to another embodiment, the head unit 200 may eject the ink I while both the target substrate SUB and the head unit 200 are moving. The way of ejecting the ink by the head unit 200 is not limited to a particular one.

In some embodiments, when the head unit 200 moves, the apparatus 10 may further include a transfer device (not shown) for moving the head unit 200.

As shown in FIG. 7, the head unit 200 may include a body 210, a nozzle unit 230, and a first coating portion 250.

The body 210 may surround the nozzle unit 230.

The nozzle unit 230 may be disposed on the lower surface of the body 210. The nozzle unit 230 may be passages through which the ink I may be ejected to the outside. In an embodiment, the nozzle unit 230 may have, but is not limited to, a circular or square shape when viewed from the top, for example.

The first coating portion 250 may be disposed on the lower surface of the body 210. The first coating portion 250 may be disposed on the entirety of the surface of the body 210. The first coating portion 250 may be disposed on the inner walls of the nozzle unit 230. The apparatus 10 according to this embodiment includes the first coating portion 250, and thus it may adjust the diameter of the nozzle unit 230 and the ink ejection characteristics.

The structure of the head unit 200 and the structure of the first coating portion 250 will be described below with reference to FIG. 8 or the like.

Figure 8:
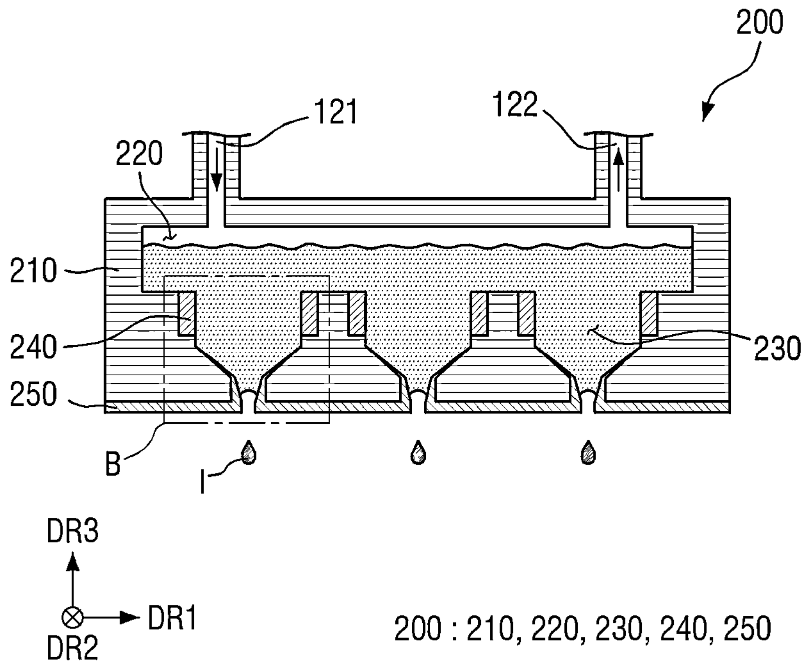
FIG. 8 is a cross-sectional view showing an embodiment of a head unit according to the disclosure.
Figure 9:
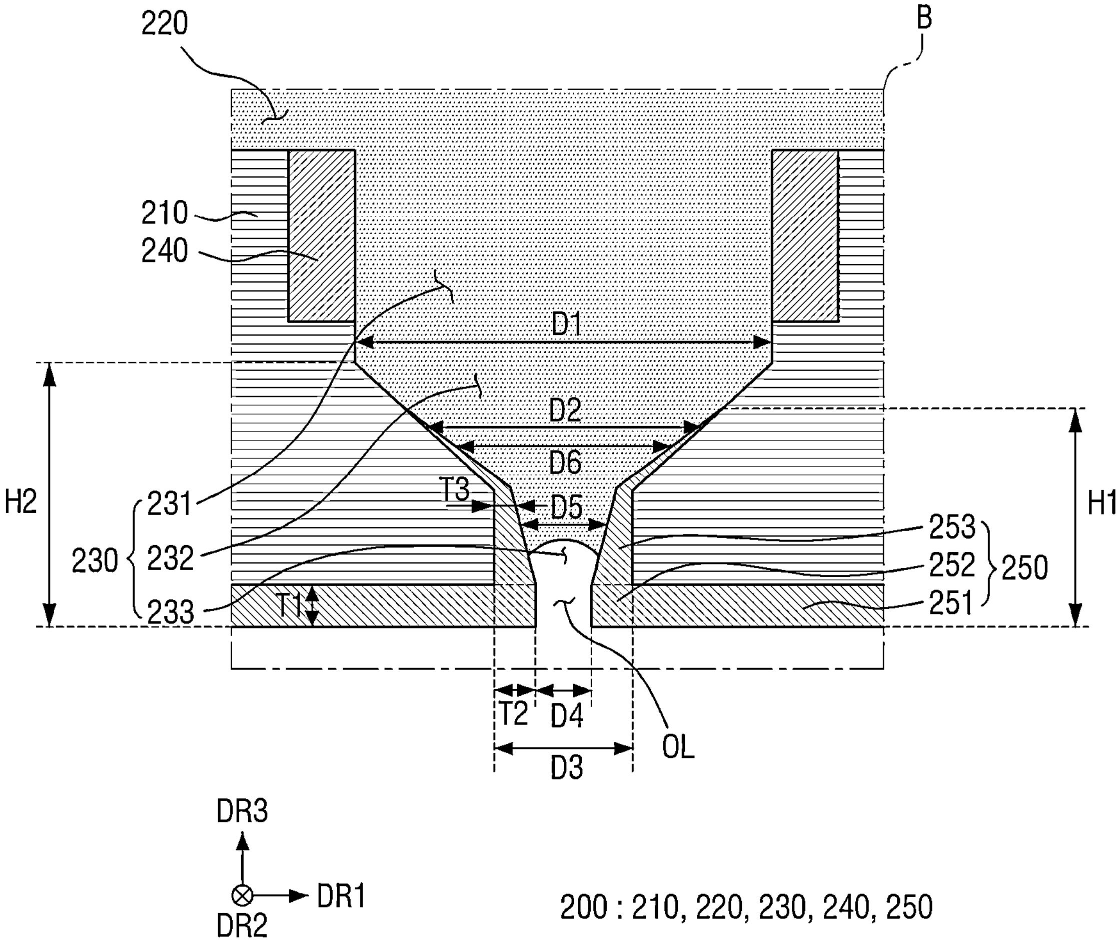
FIG. 9 is an enlarged view of area B of FIG. 8.
Figure 10:
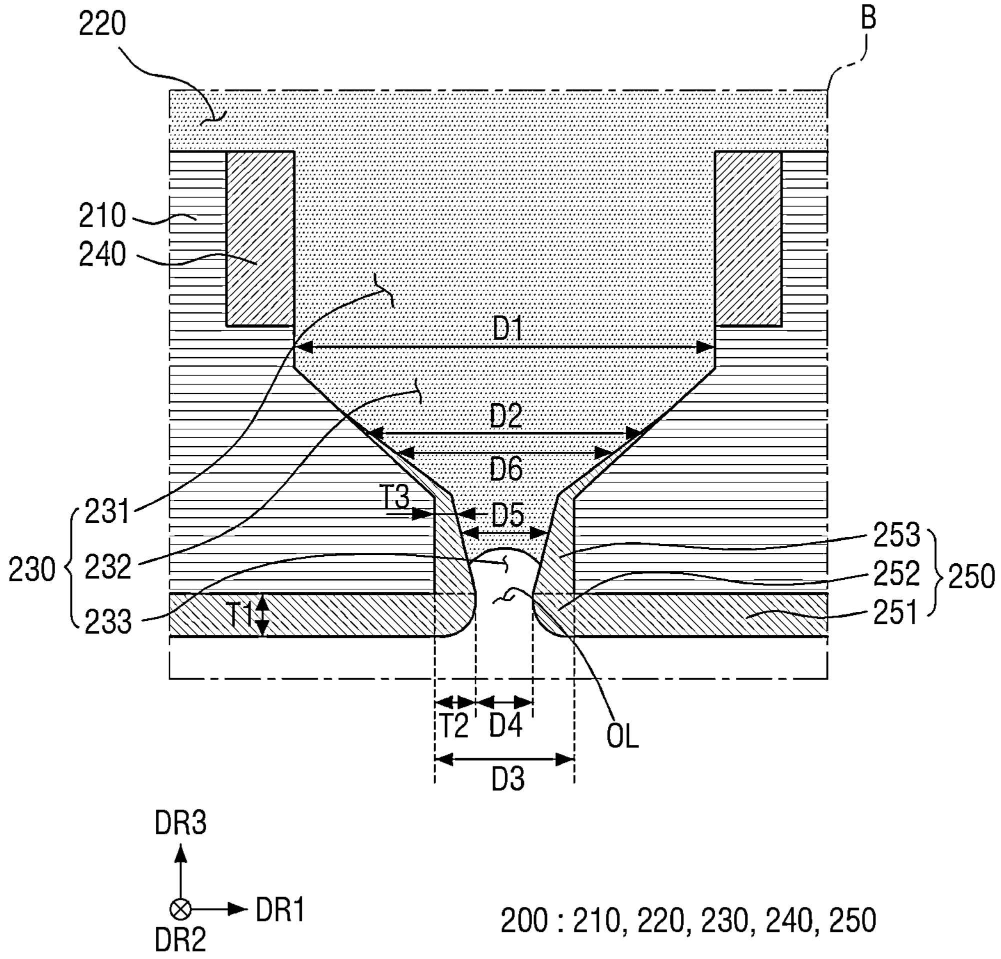
FIG. 10 is a cross-sectional view showing an embodiment of a head unit according to the disclosure.

FIG. 8 is a cross-sectional view showing an embodiment of a head unit according to the disclosure. FIG. 9 is an enlarged view of area B of FIG. 8. FIG. 10 is a cross-sectional view showing another embodiment of a head unit according to the disclosure.

Referring to FIGS. 8 to 10, the head unit 200 may include a body 210, an ink reservoir 220, nozzle unit 230, an ejection controller 240, and a first coating portion 250.

The body 210 may at least partially surround the ink reservoir 220, the nozzle unit 230, the ejection controller 240, and the first coating portion 250. The body 210 may form the exterior of the head unit 200.

The body 210 may be connected to the first pipe 121 and the second pipe 122. In some embodiments, the body 210 may define through holes in the upper outer wall. The first pipe 121 and the second pipe 122 with the ink reservoir 220 may be connected to each other by the through holes.

The ink reservoir 220 may be a space where the ink I supplied from the supply unit 100 to the head unit 200 is temporarily stored before it is ejected to the outside through the nozzle unit 230.

The nozzle unit 230 may be disposed at the lower portion of the body 210. The nozzle unit 230 may penetrate the lower outer wall of the body 210 in the third direction DR3. The nozzle unit 230 may be passages through which the ink I may be ejected to the outside. Although only three nozzle units 230 are shown in the drawings for convenience of illustration, the number of the nozzle unit 230 is not limited to three.

The nozzle unit 230 may include a variety of shapes such as a cylinder and a square column. As shown in the drawings, in the embodiment of the disclosure, the nozzle unit 230 may have a funnel or Venturi tube shape.

In an embodiment, a nozzle unit 230 may include a first passage 231, a second passage 232, and a third passage 233, for example.

The first passage 231 may be disposed on one side, i.e., on the lower side of the ink reservoir 220 in the third direction DR3. The first passage 231 may connect the ink reservoir 220 with the second passage 232. The ejection controller 240 may be disposed outside the first passage 231. In an embodiment of the disclosure, the first passage 231 may have a cylindrical shape. The first width D1, which is the width of the first passage 231, may be constant along the third direction DR3, but the disclosure is not limited thereto.

The second passage 232 may be disposed on one side, i.e., on the lower side of the first passage 231 in the third direction DR3. In an embodiment, the second passage 232 may be disposed on the opposite side of the ink reservoir 220 with the first passage 231 therebetween, for example. The second passage 232 may connect the first passage 231 with the third passage 233. A part of the first coating portion 250 may be disposed inside the second passage 232. In an embodiment of the disclosure, the second passage 232 may have a truncated cone shape. The second width D2, which is the width of the second passage 232, may become narrower toward the opposite side of the third direction DR3, i.e., toward the lower side, but the disclosure is not limited thereto.

The third passage 233 may be disposed on one side, i.e., on the lower side of the second passage 232 in the third direction DR3. In an embodiment, the third passage 233 may be disposed on the opposite side of the first passage 231 with the second passage 232 therebetween, for example. The third passage 233 may connect the second passage 232 with the outside. A part of the first coating portion 250 may be disposed inside the third passage 233. In an embodiment of the disclosure, the third passage 233 may have a cylindrical shape. The third width D3, which is the width of the third passage 233, may be constant along the third direction DR3, but the disclosure is not limited thereto.

The first to third widths D1, D2 and D3 may be the diameters of the first to third passages 231, 232 and 233 in the horizontal direction defined by the first direction DR1 and the second direction DR2.

The ejection controller 240 may include a piezoelectric element. In an embodiment, the ejection controller 240 may be a piezoelectric element and may include a piezoelectric substrate, a first electrode and a second electrode, for example. The piezoelectric substrate may be a piezoelectric substrate and may include a piezoelectric material that is deformed depending on a driving voltage applied to each of the first and second electrodes. The piezoelectric substrate may contract or expand depending on the difference between the driving voltages applied to the first electrode and the second electrode, to generate elastic waves. The ink I disposed inside the nozzle unit 230 may be ejected toward the target substrate SUB by the pressure of the elastic waves generated from the ejection controller 240.

The ejection controller 240 may be disposed on one side of the nozzle unit 230. In an embodiment, the ejection controller 240 may be disposed outside the first passage 231 of the nozzle unit 230 to surround the nozzle unit 230, for example. It should be understood, however, that the disclosure is not limited thereto. The ejection controller 240 may be disposed outside the nozzle unit 230 to surround only a part of the nozzle unit 230 or may be disposed only on one side of the nozzle unit 230.

Although the ejection controller 240 is disposed on the opposite sides of the nozzle unit 230 in the cross-sectional view, it is to be understood that this does not mean that the ejection controller 240 is disposed only on the opposite sides of the nozzle unit 230. In an embodiment, even though the ejection controller 240 surrounds an entirety of the nozzle unit 230, the ejection controller 240 may look as when it is disposed on the opposite sides of the nozzle unit 230 as in the cross-sectional view of FIG. 8.

The piezoelectric element of the ejection controller 240 may be disposed in each nozzle of the nozzle unit 230, but the disclosure is not limited thereto. One piezoelectric element may be provided for each nozzle, or a plurality of piezoelectric elements may be provided in one nozzle. In the following description, an example will be given where one piezoelectric element is provided for each nozzle as shown in the drawings for convenience of illustration.

The first coating portion 250 may be disposed on the bottom of the head unit 200 and a part of the inner surface of the nozzle unit 230. The first coating portion 250 may cover the bottom of the head unit 200 and a part of the inner surface of the nozzle unit 230.

In the apparatus 10 according to this embodiment, the first coating portion 250 disposed on a part of the inner surface of the nozzle unit 230 may adjust the nozzle diameter of the head unit 200. In an embodiment, the third width D3, which is the width of the third passage 233 of the nozzle unit 230, may be, but is not limited to, approximately 25 micrometers (μm), for example. In order to achieve a high-resolution fine line width, it is desired to further reduce the third width D3, which is the width of the third passage 233. Typically, in order to form the nozzle unit 230, micro-precision processing using a laser drill may be performed. Unfortunately, the minimum processing width is limited by laser drill micro-precision processing, and yield issues may occur due to processing errors as the width becomes smaller. In view of the above, the apparatus 10 according to this embodiment includes the first coating portion 250, so that the diameter of the nozzles, i.e., the diameter of the outlets OL, may be formed smaller.

In addition, in the apparatus 10 according to this embodiment, the first coating portion 250 may improve the durability of the head unit 200 to prevent damage to the head unit 200. In an embodiment, after the ink (I) has been ejected, a cleaning process using a wiper may be performed to remove the ink I remaining on the bottom of the head unit 200 or the nozzle unit 230, for example. In doing so, it is possible to prevent damage to the head unit 200 by avoiding the wiper from being in direct contact with the bottom of the head unit 200 or the nozzle unit 230.

In some embodiments, the first coating portion 250 may be formed via a deposition process. In an embodiment, the first coating portion 250 may be formed via a physical vapor deposition ("PVD") process or an atomic layer deposition ("ALD") process, for example. The first coating portion 250 may include, but is not limited to, at least one of silicon oxide (SiOx), aluminum oxide (AlOx), and parylene-based materials.

The first coating portion 250 may have a Venturi tube or orifice shape. In an embodiment, the first coating portion 250 may have an overhang shape whose thickness increases toward the outlet OL inside the nozzle unit 230, for example.

In some embodiments, the first coating portion 250 may include a first portion 251, a second portion 252, and a third portion 253. In the following description, the first to third portions 251, 252 and 253 are separately described for convenience of illustration, but the first to third portions 251, 252 and 253 may be physically connected with each other as one body.

The first portion 251 may be disposed on the bottom of the head unit 200. The first portion 251 may be extended in the horizontal direction defined by the first direction DR1 and the second direction DR2. According to the embodiment, the first portion 251 may be disposed over the entirety of the bottom of the head unit 200, but the disclosure is not limited thereto.

According to the embodiment, the first portion 251 may be flat on the bottom of the head unit 200, but the disclosure is not limited thereto. Specifically, the first thickness T1, which is the thickness of the first portion 251, may be constant, but the disclosure is not limited thereto. The first thickness T1, which is the thickness of the first portion 251, may refer to the thickness in the third direction DR3, i.e., the vertical direction. In an embodiment of the disclosure, the average of the first thickness T1 may be equal to or greater than approximately 300 nm.

The second portion 252 may be disposed on one side of the first portion 251. In an embodiment, the second portion 252 may be disposed between the first portion 251 and the outlet OL, for example. The second portion 252 may connect the first portion 251 with the third portion 253. The second portion 252 may be surrounded by the first portion 251 when viewed from the top.

According to the embodiment, as shown in FIG. 9, the shape of the second portion 252 may be quadrangular, e.g., rectangular in cross-section, but the disclosure is not limited thereto. In an embodiment, the shape of the second portion 252 may be a quadrant shape including a curve in cross section as shown in FIG. 10, for example. The shape of the second portion 252 may vary depending on the conditions of the deposition process.

The second portion 252 may surround the outlet OL. Accordingly, the diameter of the outlet OL may be reduced by the second thickness T2, which is the thickness of the second portion 252. In an embodiment, the diameter of the outlet OL may decrease from the third width D3, which is the width of the third passage 233, to the fourth width D4. The fourth width D4 may mean the average of the diameter of the outlet OL, for example.

According to the embodiment, the third width D3 may be approximately 25 μm, and the fourth width D4 may be approximately 24.5 μm, as described above. According to the embodiment, the second thickness T2 may be equal to or greater than approximately 300. In another embodiment, when the thickness of the second portion 252 changes in the third direction DR3, the maximum value of the second thickness T2 may be equal to or greater than approximately 300 nm.

The third portion 253 may be disposed on the inner surfaces of the second passage 232 and the third passage 233 of the nozzle unit 230. The third portion 253 may be extended extend along the extension direction of the second passage 232 and the third passage 233. The third portion 253 may be disposed on one side of the second portion 252 in the third direction DR3.

The third portion 253 may have a shape that becomes narrower in the third direction DR3, that is, toward the top. In an embodiment, the third thickness T3, which is the thickness of the third portion 253, may have a shape that becomes narrower toward the top, for example. Herein, the third thickness T3 refers to the thickness in the normal direction perpendicular to the surface where the third portion 253 contacts the second passage 232 and the third passage 233.

The third portion 253 may surround the inner space of the second passage 232 and the third passage 233. The diameters of the second passage 232 and the third passage 233 may be reduced by the third thickness T3, which is the thickness of the third portion 253. In an embodiment, the second width D2, which is the width of the second passage 232, and the third width D3, which is the width of the third passage 233, may be reduced to the sixth width D6 and the fifth width D5, respectively, for example.

In some embodiments, the third width D3 may be smaller than the second width D2, and the second width D2 may be smaller than the first width D1. Accordingly, as the ink I moves toward the outlet OL, the ejection rate of the ink I may be improved by Bernoulli Principle.

In the apparatus 10 according to this embodiment, when the first coating portion 250 is formed via a physical vapor deposition process, the third thickness T3 may be reduced smaller than the first thickness T1 and the second thickness T2 due to a lower step coverage. In an embodiment, in the deposition process of the head unit 200 from the lower portion to the upper portion, as the second portion 252 is gradually extended in the horizontal direction, the second portion 252 itself may work as a mask for the inner surface of the nozzle unit 230, for example. Due to such self-masking effect, the third thickness T3 may become smaller than the first thickness T1 and the second thickness T2. According to the embodiment, the average of the third thickness T3 may be 0.3 times or less the first thickness T1 and the second thickness T2.

Accordingly, in the apparatus 10 according to this embodiment, the fourth width D4 may be smaller than the fifth width D5, and the fifth width D5 may be smaller than the sixth width D6. Accordingly, the ejection rate of the ink I may be further improved by Bernoulli's principle. This will be described later with reference to FIG. 11.

In addition, as the thickness of the first coating portion 250 may be easily adjusted via the deposition process, by adjusting the diameter of the outlet OL, the ink ejection characteristics by Ohnesorge number may be easily controlled. Accordingly, restrictions due to the viscosity, the surface tension, the density of the ink, etc. are reduced, thereby improving the degree of freedom in ink selection.

In some embodiments, the first coating portion 250 may not be disposed on the first passage 231 of the nozzle unit 230. In an embodiment, the first coating portion 250 may not contact the first passage 231 of the nozzle unit 230, for example. Accordingly, the first coating portion 250 may not overlap with the ejection controller 240 in the horizontal direction. The first coating portion 250 may not contact the ejection controller 240. In an embodiment, a coating depth H1 of the first coating portion 250 in the third direction DR3 may be smaller than a distance H2 between the bottom of the first coating portion 250 and the first passage 231 of the nozzle unit 230, for example. The coating depth H1 of the first coating portion 250 in the third direction DR3 may be, but is not limited to, approximately 75 μm.

In the apparatus 10 according to this embodiment, the first coating portion 250 is not in contact with the ejection controller 240, and thus the quality of the ink ejected from the head unit 200 may be improved. In an embodiment, when the first coating portion 250 contacts the ejection controller 240, the piezoelectric driving of the ejection controller 240 may be affected. When this happens, the quality of the ejected ink I may deteriorate. In contrast, in the apparatus 10 according to this embodiment, the first coating portion 250 is not in contact with the ejection controller 240 and thus it does not affect the piezoelectric driving of the ejection controller 240, so that the quality of ejected ink may be improved.

In addition, in the apparatus 10 according to this embodiment, the first coating portion 250 is not in contact with the ejection controller 240, so that it is possible to prevent the first coating portion 250 from being deformed or separated due to the piezoelectric driving of the ejection controller 240.

Figure 11:
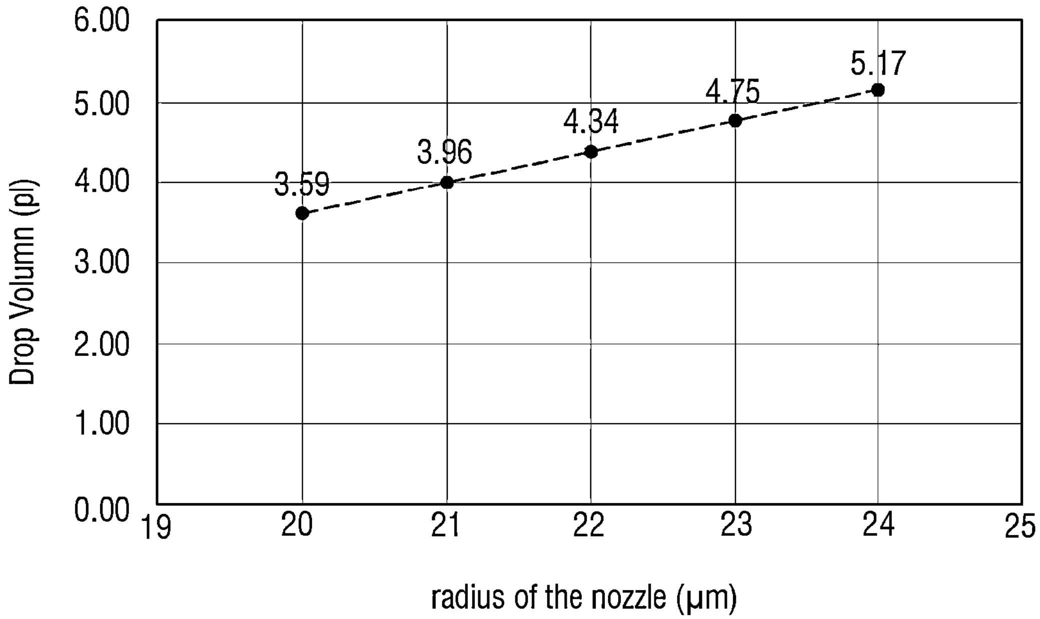
FIG. 11 is a graph showing an embodiment of the volume of ink drop versus the diameter of the nozzle of the head unit.

FIG. 11 is a graph showing an embodiment of the volume of ink drop versus the diameter of the nozzle of the head unit.

Referring to FIG. 11 in conjunction with FIGS. 8 to 10, the graph of FIG. 11 shows the volume of ink drop versus the diameter of the nozzle of the head unit 200, i.e., the diameter of the outlet OL.

It may be seen from the graph that as the diameter of the nozzle, i.e., the diameter of the outlet OL, decreases, the volume of the ink drop decreases. In an embodiment, it may be seen that when the diameter of the outlet OL decreases by 1 μm, the volume of the ink drop decreases by approximately 0.4 picolitre (pl), for example.

The apparatus 10 according to this embodiment includes the first coating portion 250, and thus it may adjust the diameter of the nozzles of the head unit 200. Accordingly, it is possible to achieve a high-resolution fine line width, so that the resolution of a display device manufactured using the apparatus 10 may be improved.

Figure 12:
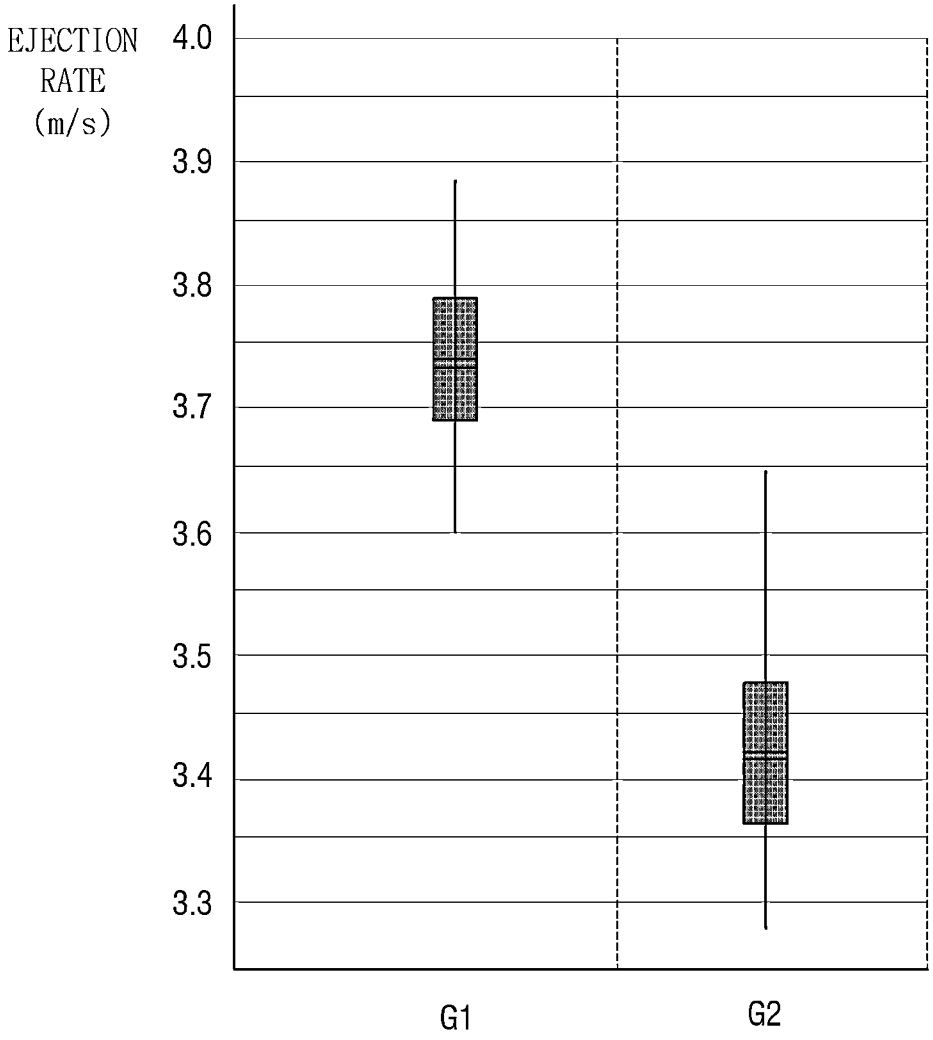
FIG. 12 is a graph for comparing an embodiment of ink ejection rates between an existing head unit and a head unit according to the disclosure.

FIG. 12 is a graph for comparing ink ejection rates between an existing head unit and an embodiment of a head unit according to the disclosure.

Referring to FIG. 12 in conjunction with FIGS. 8 to 10, the existing head unit 200 may not include the first coating portion 250. As indicated by a second bar G2, the ink ejection rate of the existing head unit 200 without the first coating portion 250 may be approximately 3.4 meters per second (m/s).

In contrast, the head unit 200 in the embodiment includes the first coating portion 250 in a Venturi tube shape or an orifice shape, so that it may eject the ink I at a higher rate than the existing head unit 200. In an embodiment, as indicated by a first bar G1, the ink ejection rate of the head unit 200 in the embodiment may be approximately 3.75 m/s, for example.

As described above, in the apparatus 10 according to this embodiment, the third thickness T3 is smaller than the first thickness T1 and the second thickness T2, and the third thickness T3 has a shape that narrows toward the top. Accordingly, the ink ejection rate may be further improved by Bernoulli's principle.

Hereinafter, a display device in another embodiment of the disclosure will be described. In the following description, the same or similar elements will be denoted by the same or similar reference numerals, and redundant descriptions will be omitted or briefly described.

Figure 13:
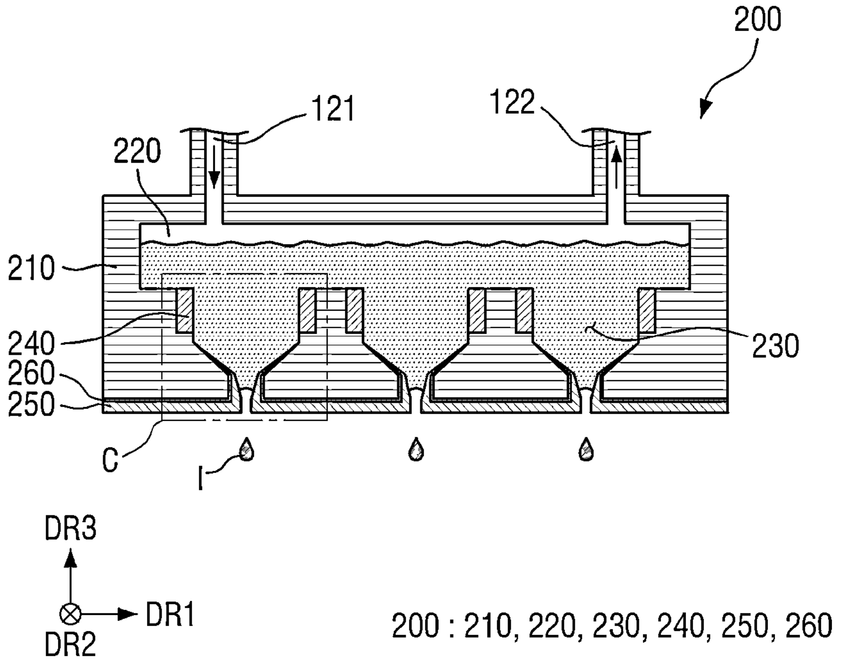
FIG. 13 is a cross-sectional view showing another embodiment of a head unit according to the disclosure.
Figure 14:
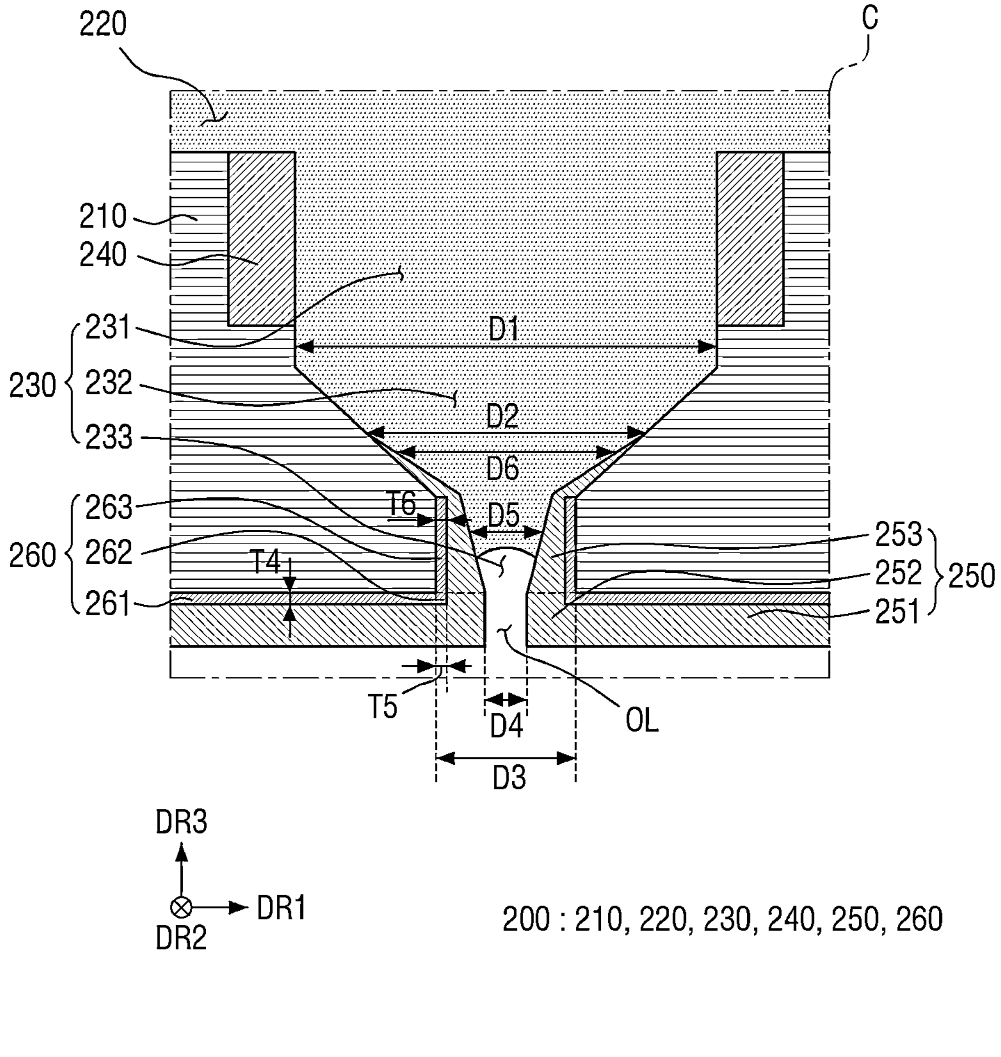
FIG. 14 is an enlarged view of area C of FIG. 13.
Figure 15:
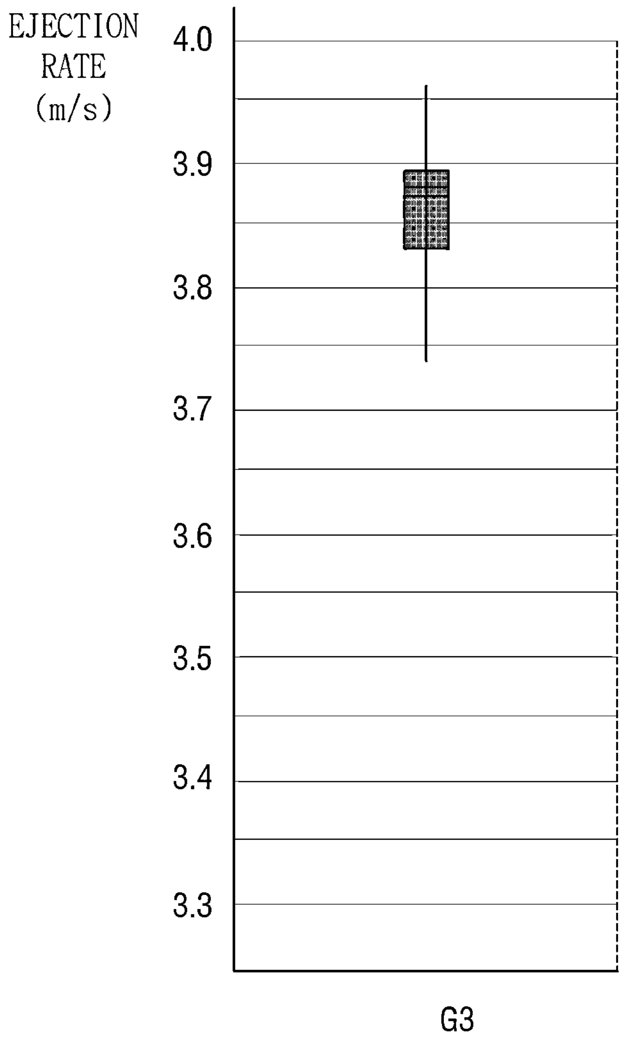
FIG. 15 is a graph showing another embodiment of the ink ejection rate of a head unit according to the disclosure.

FIG. 13 is a cross-sectional view showing another embodiment of a head unit according to the disclosure. FIG. 14 is an enlarged view of area C of FIG. 13. FIG. 15 is a graph showing another embodiment of the ink ejection rate of a head unit according to the disclosure.

Referring to FIGS. 13 to 15, the head unit 200 may further include a second coating portion 260.

The second coating portion 260 may be disposed between the first coating portion 250 and the bottom of the head unit 200 and between the first coating portion 250 and the inner surface of the nozzle unit 230. The second coating portion 260 may cover the bottom of the head unit 200 and a part of the inner surface of the nozzle unit 230. The first coating portion 250 may cover the second coating portion 260.

According to the embodiment of the disclosure, the second coating portion 260 may include a fourth portion 261, a fifth portion 262, and a sixth portion 263. In the following description, the fourth to sixth portions 261, 262 and 263 are separately described for convenience of illustration, but the fourth to sixth portions 261, 262 and 263 may be physically connected with each other as one body.

The fourth portion 261 may be disposed on the bottom of the head unit 200. The fourth portion 261 may be extended in the horizontal direction defined by the first direction DR1 and the second direction DR2. According to the embodiment, the fourth portion 261 may be disposed over the entirety of the bottom of the head unit 200, but the disclosure is not limited thereto.

According to the embodiment, the fourth portion 261 may be flat on the bottom of the head unit 200, but the disclosure is not limited thereto. Specifically, the fourth thickness T4, which is the thickness of the fourth portion 261, may be constant, but the disclosure is not limited thereto. The fourth thickness T4, which is the thickness of the fourth portion 261, may refer to the thickness in the third direction DR3, i.e., the vertical direction.

The first portion 251 of the first coating portion 250 may be disposed on the fourth portion 261. The first portion 251 may cover the fourth portion 261.

The fifth portion 262 may be disposed on one side of the fourth portion 261. In an embodiment, the fifth portion 262 may be disposed between the fourth portion 261 and the outlet OL. The fifth portion 262 may connect the fourth portion 261 with the sixth portion 263. The fifth portion 262 may be surrounded by the fourth portion 261 when viewed from the top.

The second portion 252 of the first coating portion 250 may be disposed on the fifth portion 262. The second portion 252 may cover the fifth portion 262.

The second portion 252 and the fifth portion 262 may surround the outlet OL. Accordingly, the diameter of the outlet OL may be reduced by the second thickness T2, which is the thickness of the second portion 252 (refer to FIG. 9), and the fifth thickness T5, which is the thickness of the fifth portion 262. In an embodiment, the diameter of the outlet OL may decrease from the third width D3, which is the width of the third passage 233, to the fourth width D4. The fourth width D4 according to this embodiment may be further reduced by the fifth thickness T5 compared to the fourth width D4 in the embodiment described above with reference to FIG. 8 or the like.

The sixth portion 263 may be disposed on the inner surface of the third passage 233 of the nozzle unit 230. The sixth portion 263 may be extended along the direction in which the third passage 233 is extended. The sixth portion 263 may be disposed on one side of the fifth portion 262 in the third direction DR3.

Although the sixth portion 263 is disposed only on the inner surface of the third passage 233 in the drawings, but the disclosure is not limited thereto. In an embodiment, the sixth portion 263 may also be disposed on the inner surface of the second passage 232. That is to say, the sixth portion 263 may be extended onto the inner surface of the second passage 232.

According to the embodiment, the sixth portion 263 may be flat on the inner surface of the third passage 233, but the disclosure is not limited thereto. Specifically, the sixth thickness T6, which is the thickness of the sixth portion 263, may be constant, but the disclosure is not limited thereto. The sixth thickness T6, which is the thickness of the sixth portion 263, may refer to the thickness in the horizontal direction.

The third portion 253 of the first coating portion 250 may be disposed on the sixth portion 263. The third portion 253 may cover the sixth portion 263.

The sixth portion 263 may surround the inner space of the third passage 233. The diameter of the third passage 233 may be reduced by the third thickness T3, which is the thickness of the third portion 253 (refer to FIG. 9), and the sixth thickness T6, which is the thickness of the sixth portion 263. In an embodiment, the third width D3, which is the width of the third passage 233, may be reduced to the fifth width D5, for example. The fifth width D5 according to this embodiment may be further reduced by the sixth thickness T6 than the fifth width D5 in the embodiment described above with reference to FIG. 8 or the like.

In the apparatus 10 according to this embodiment, the fourth to sixth thicknesses T4, T5 and T6 may be substantially all equal. In an embodiment, the second coating portion 260 may be formed via an atomic layer deposition process with a higher step coverage, for example. In this instance, the thickness of the second coating portion 260 may be constant. That is to say, the fourth to sixth thicknesses T4, T5 and T6, which are the thicknesses of the fourth to sixth portions 261, 262 and 263, may be all equal.

Since the apparatus 10 according to this embodiment further includes the second coating portion 260 having a constant thickness, it may precisely control the diameter of the outlet OL. In this manner, the ink ejection characteristics may be precisely controlled.

Incidentally, the apparatus 10 according to this embodiment includes the first coating portion 250 as well as the second coating portion 260, and thus it may further improve the ink ejection rate. In an embodiment, as indicated by a third bar G3 in the graph shown in FIG. 15, the ink ejection rate of the head unit 200 according to this embodiment may be approximately 3.85 m/s, for example. The head unit 200 according to this embodiment includes both the first coating portion 250 in a Venturi tube shape or an orifice shape and the second coating portion 260 with a constant thickness, so that it may eject the ink I at a higher rate than the ink ejection rate of the apparatus 10 in the embodiment of FIG. 8 or the like.

In concluding the detailed description, those skilled in the art will appreciate that many variations and modifications may be made to the preferred embodiments without substantially departing from the principles of the disclosure. Therefore, the disclosed preferred embodiments of the invention are used in a generic and descriptive sense only and not for purposes of limitation.

What is claimed is:

1. An apparatus for manufacturing display devices, the apparatus comprising:
- a stage; and
- a head unit disposed above the stage in a vertical bottom-to-top direction, the head unit comprising:
  - a nozzle unit;
  - a body; and
  - a first coating portion covering a lower surface of the body and at least a part of an inner surface of the nozzle unit,
- wherein the first coating portion has a single-layer structure, and a thickness of at least a part of the first coating portion taken along a horizontal direction perpendicular to the vertical bottom-to-top direction becomes gradually narrower from the lower surface of the body toward a top of the first coating portion in the vertical bottom-to-top direction.

2. The apparatus of claim 1, wherein the first coating portion has a Venturi tube shape or an orifice shape.

3. The apparatus of claim 1, wherein the first coating portion comprises:
- a first portion disposed on the lower surface of the body;
- a second portion disposed on one side of the first portion; and
- a third portion disposed on one side of the second portion and disposed on the inner surface of the nozzle unit.

4. The apparatus of claim 3, wherein a thickness of the third portion becomes gradually narrower toward the top of the first coating portion.

5. The apparatus of claim 4, wherein the thickness of the third portion is smaller than a thickness of the first portion.

6. The apparatus of claim 5, wherein an average of the thickness of the third portion is 0.3 times or less than the thickness of the first portion.

7. The apparatus of claim 1, wherein a width of at least a part of the nozzle unit becomes narrower toward a top of the nozzle unit.

8. The apparatus of claim 7, wherein the nozzle unit has a Venturi tube or funnel shape.

9. The apparatus of claim 7, wherein the head unit further comprises an ink reservoir which stores an ink, wherein the nozzle unit comprises:

a first passage connected to the ink reservoir;

a second passage connected to the first passage; and a third passage connected to the second passage, and wherein the second passage becomes wider to the top of the nozzle unit.

10. The apparatus of claim 9, wherein at least one of a width of the first passage and a width of the third passage is constant.

11. The apparatus of claim 1, wherein the head unit further comprises an ejection controller disposed outside the nozzle unit, and wherein the first coating portion does not overlap with the ejection controller.

12. The apparatus of claim 11, wherein the first coating portion is not in direct contact with the ejection controller.

13. The apparatus of claim 12, wherein the ejection controller comprises a piezoelectric element.

14. The apparatus of claim 1, wherein the first coating portion exposes at least a part of the inner surface of the nozzle unit.

15. The apparatus of claim 1, wherein the first coating portion is formed by a physical vapor deposition process.

16. The apparatus of claim 1, further comprising: a second coating portion disposed between the first coating portion and the bottom surface of the body and between the first coating portion and at least a part of the inner surface of the nozzle unit.

17. The apparatus of claim 16, wherein a thickness of the second coating portion is constant.

18. The apparatus of claim 17, wherein the second coating portion comprises:

a first portion disposed on the lower surface of the body;

a second portion disposed on one side of the first portion; and a third portion disposed on one side of the second portion and disposed on the inner surface of the nozzle unit.

19. The apparatus of claim 18, wherein a thickness of the first portion, a thickness of the second portion and a thickness of the third portion are equal to each other.

20. The apparatus of claim 16, wherein the second coating portion is formed by an atomic layer deposition process.

* * * * *